United States Patent [19]

Lawton

[11] Patent Number: 5,382,919
[45] Date of Patent: Jan. 17, 1995

[54] WIDEBAND CONSTANT IMPEDANCE AMPLIFIERS

[75] Inventor: Rodney J. Lawton, Swindon, England

[73] Assignee: Plessey Semiconductors Limited, England

[21] Appl. No.: 139,437

[22] Filed: Oct. 20, 1993

[30] Foreign Application Priority Data

Oct. 28, 1992 [GB] United Kingdom ............... 9222665

[51] Int. Cl.6 ................ H03F 1/34; H03F 3/45
[52] U.S. Cl. ................. 330/260; 330/102; 330/103; 330/275; 330/293
[58] Field of Search ......... 330/148, 100, 102, 103, 330/105, 258, 260, 275, 293, 301, 85

[56] References Cited

U.S. PATENT DOCUMENTS

| | | | |
|---|---|---|---|
| 3,208,000 | 9/1965 | Stromer | 330/100 X |
| 4,218,659 | 8/1980 | Arai | 330/6 |
| 4,303,891 | 12/1981 | Achtstaetter | 330/301 X |
| 4,468,628 | 8/1984 | Gross | 330/260 X |
| 4,553,108 | 11/1985 | Young | 330/300 |
| 4,879,525 | 11/1989 | Larkin | 330/294 |
| 5,124,667 | 6/1992 | Chevallier | 330/293 |

FOREIGN PATENT DOCUMENTS

| | | |
|---|---|---|
| 0124983 | 11/1984 | European Pat. Off. . |
| 0467450 | 1/1992 | European Pat. Off. . |
| 940980 | 11/1963 | United Kingdom . |
| 1137706 | 12/1968 | United Kingdom . |
| 1274660 | 5/1972 | United Kingdom . |

*Primary Examiner*—James B. Mullins
*Attorney, Agent, or Firm*—Kirschstein, Ottinger, Israel & Schiffmiller et al.

[57] ABSTRACT

A family of wideband amplifier circuits using series and shunt feedback over two stages to achieve constant impedance, including single-ended, single-ended input/differential output and differential input/differential output forms.

8 Claims, 2 Drawing Sheets

WIDEBAND CONSTANT IMPEDANCE AMPLIFIERS

BACKGROUND OF THE INVENTION

1. Field of the Invention

The present invention relates to wideband constant impedance amplifiers, a widely used class of amplifiers of particular importance in high frequency transmission line and radio communication systems.

2. Description of the Related Art

A series of known amplifier circuits are based on the use of shunt/series feedback, as represented by the equivalent circuit shown in the accompanying FIG. 1. If the amplifier is assumed to be ideal the characteristic equations of the circuit are $RIN=RL$, for $RF=RL \times G$ and $RE=RL/G$, where G is the open-loop voltage gain of the amplifier.

SUMMARY OF THE INVENTION

According to one aspect of the present invention a wideband constant impedance amplifier comprises first, second and third transistors each having a control electrode and an output current path between first and second output electrodes, the control electrode of the first transistor being connected to an input terminal of the amplifier, the first output electrode of the first transistor being connected by way of the output current path of the second transistor to a point of reference potential and by way of a first resistive element to the control electrode of the second transistor, the second output electrode of the first transistor being connected to load means and to the control electrode of the third transistor, and the first output electrode of the third transistor being connected to the control electrode of the first transistor by way of a second resistive element and to the control electrode of the second transistor by way of a third resistive element, the second output electrode of the third transistor being connected to an output terminal of the amplifier.

Preferably the third resistive element has a value of resistance equal to the required output resistance of the amplifier, and the first and second resistive elements have values of resistance respectively smaller and greater than said required output resistance by a factor equal to the open-loop voltage gain of said first transistor.

According to another aspect of the present invention a wideband constant impedance amplifier comprises first, second, third and fourth transistors each having a control electrode and an output current path between first and second output electrodes, the control electrode of the first transistor being connected to an input terminal of the amplifier, the first output electrode of the first transistor being connected to a point of reference potential by way of a first resistive element, the second output electrode of the first transistor being connected to load means and to the control electrode of the second transistor, the second and third transistors having their first output electrodes connected to respective current sources and by way of second and third resistive means to the control electrode of the fourth transistor, the first output electrode of the second transistor also being connected to the control electrode of the first transistor by way of a fourth resistive element, the first output electrode of the fourth transistor being connected to a point of reference potential and the second output electrode of the fourth transistor being connected to load means and to the control electrode of the third transistor, the second output electrodes of the second and third transistors being connected to respective output terminals of the amplifier.

Preferably the second and third resistive elements each have a value of resistance equal to half the required output resistance of the amplifier, and the first and fourth resistive elements have values of resistance respectively smaller and greater than the values of the second and third resistive elements by a factor equal to the open-loop voltage gain of the first transistor.

According to another aspect of the present invention a wideband constant impedance amplifier comprises first, second, third and fourth transistors each having a control electrode and an output current path between first and second output electrodes, the control electrode of the first transistor being connected to an input terminal of the amplifier, the first output electrodes of the first and third transistors being connected together and by way of a current source to a point of reference potential, the second output electrode of the first transistor being connected to load means and to the control electrode of the second transistor, the first output electrode of the second transistor being connected by way of a first resistive element to a point of reference potential and by way of a second resistive element to the control electrode of the first transistor, the second output electrode of the third transistor being connected to load means and to the control electrode of the fourth transistor, and the control electrode of the third transistor being connected by way of a third resistive element to a point of reference potential and by way of a fourth resistive element to the first output electrode of the fourth transistor, the second output electrodes of the second and fourth transistors being connected to respective output terminal s of the amplifier.

Preferably the first and fourth resistive elements have values of resistance equal to half the required output resistance of the amplifier, and the second and third resistive elements have values of resistance respectively greater and smaller than the values of said first and fourth resistive elements by a factor equal to the open-loop voltage gain of the first transistor.

According to another aspect of the present invention a differential input differential output wideband constant impedance amplifier comprises first, second, third and fourth transistors each having a control electrode and an output current path between first and second output electrodes, the control electrodes of the first and fourth transistors being connected to respective input terminals of the amplifier, the second output electrodes of the first and fourth transistors being connected to respective load means and to the control electrodes of the second and third transistors respectively, the first output electrodes of the second and third transistors being connected by way of first and second resistive elements respectively to the control electrodes of the first and fourth transistors respectively, the first output electrodes of the first and third transistors being interconnected by way of a third resistive element, the first output electrodes of the second and fourth transistors being interconnected by way of a fourth resistive element, the first output electrodes of the first and fourth transistors being interconnected by way of a fifth resistive element, and the second output electrodes of the second and third transistors being connected to respective output terminals of the amplifier.

Preferably the third and fourth resistive elements have values of resistance equal to half the required output resistance of the amplifier, the first and second resistive elements have a value of resistance greater than the values of said third and fourth resistive elements by a factor equal to the open-loop voltage gain of said first transistor, and the fifth resistive element has a value of resistance smaller than said required output resistance by said factor. There may be provided means responsive to the potentials at the first output electrodes of said second and third transistors to vary the potential applied to said load means for the first and fourth transistors so as to provide common mode negative feedback.

BRIEF DESCRIPTION OF THE DRAWINGS

Wideband constant impedance amplifiers in accordance with the present invention will now be described with reference to the accompanying drawings, of which.

DETAILED DESCRIPTION OF THE PREFERRED EMBODIMENTS

Figure 2:
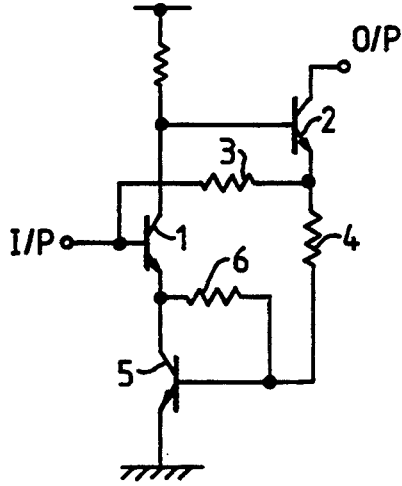
FIGS. 2 to 6 show respective embodiments of amplifiers in accordance with the invention.

Referring to FIG. 2, a single-ended embodiment comprises an input transistor 1 the collector electrode of which is connected directly to the base electrode of an output transistor 2, from the emitter electrode of which feedback is applied in operation by way of a resistor 3 to the base electrode of the transistor 1 and by way of a resistor 4 to the base electrode of a transistor 5 the collector-emitter path of which is connected in the emitter circuit of the transistor 1. The emitter electrode of the transistor 1 is itself connected to the base electrode of the transistor 5 by way of a resistor 6.

Figure 1:
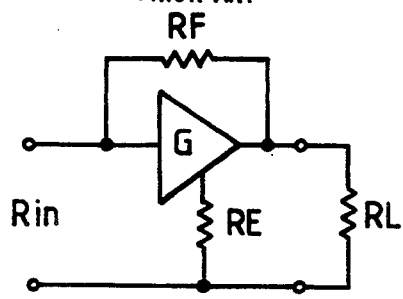
FIG. 1 shows an equivalent circuit of known amplifiers.

In this configuration the voltage gain G of the amplifier is effectively the open-loop voltage gain of the input transistor 1. To comply with the requirements for constant impedance outlined above in connection with FIG. 1, the resistor 4 has a value equal to the required output resistance, while the resistors 3 and 6 have values respectively greater and smaller than the required output resistance by a factor equal to the gain G.

Figure 3:
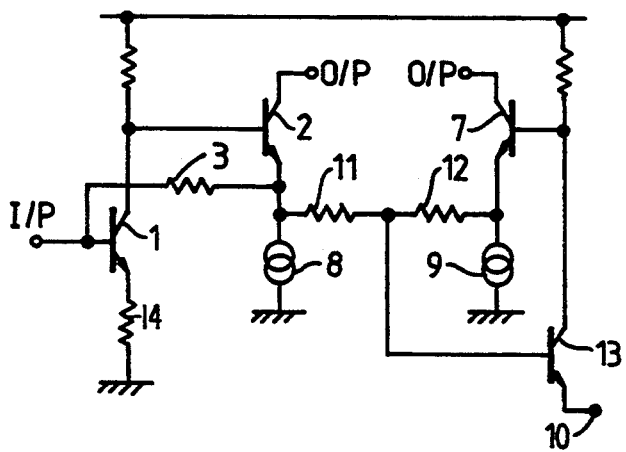

Referring to FIG. 3, a single-ended input/differential output embodiment comprises an input transistor 1 the collector electrode of which is connected directly to the base electrode of an output transistor 2, from the emitter electrode of which feedback is applied by way of a resistor 3 to the base electrode of the transistor 1, as in the embodiment of FIG. 2. In this differential-output embodiment, however, a second output transistor 7 is provided, the transistors 2 and 7 having their emitter electrodes connected to ground by way of respective current sources 8 and 9 and to a point of reference voltage 10 by way of respective resistors 11 and 12 and the base-emitter path of a transistor 13, the collector electrode of which is connected to the base electrode of the transistor 7. The connections by way of transistor 13 serve to maintain the potential at the junction between the resistors 11 and 12 close to that of the point 10, so that the potentials at the emitter electrodes of the transistors 2 and 7 are constrained to vary differentially. In this embodiment the resistors 11 and 12 are made equal in value to half the required output resistance, while the resistor 3 and the emitter resistor 14 of the transistor 1 are respectively greater and smaller than the resistors 11 and 12 by the factor G.

Figure 4:
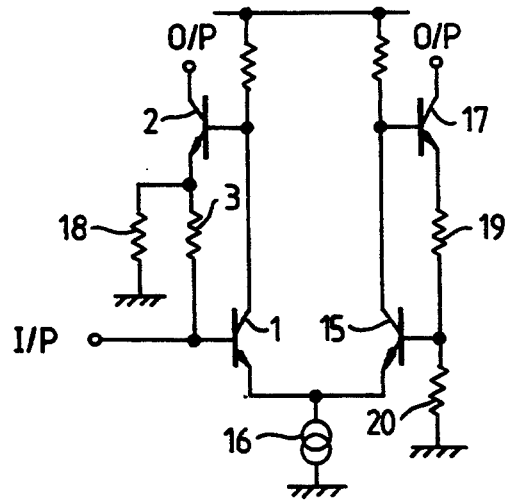

Referring to FIG. 4, in another single-ended input/differential output embodiment the input transistor 1 has emitter electrode coupled in common with that of a transistor 15 to a current source 16, the collector electrodes of the transistors 1 and 15 being directly connected respectively to the base electrodes of output transistors 2 and 17. The emitter electrode of the transistor 2 in this embodiment is connected to the base electrode of the transistor 1 by way of a resistor 3 and to ground by way of a resistor 18, while the emitter electrode of the transistor 17 is connected to the base electrode of the transistor 15 by way of a resistor 19, the base electrode of the transistor 15 in turn being connected to ground by way of a resistor 20. The resistors 18 and 19 in this case are made equal to half the required output resistance, while the resistors 3 and 20 have values respectively greater and smaller than the value of the resistors 18 and 19 by the factor G.

The emitter coupling of the transistors 1 and 15 to the current source 16 serves to provide differential drive to the output transistors 2 and 17.

Figure 5:
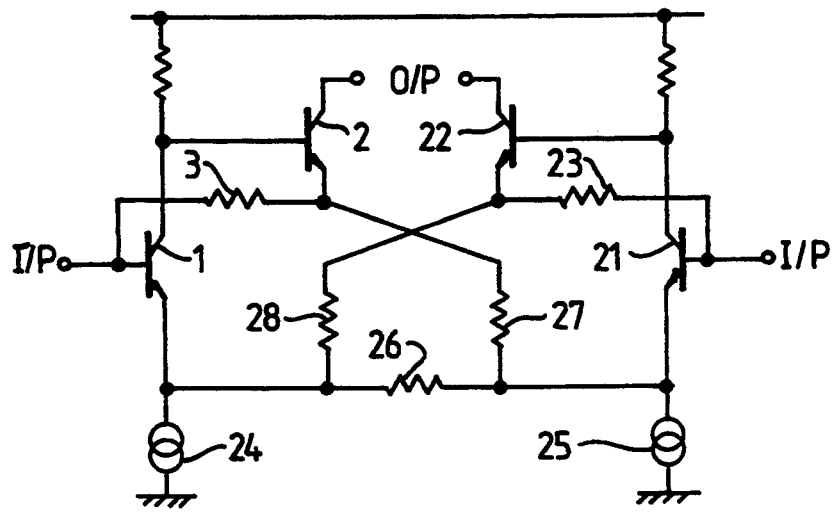
Figure 6:
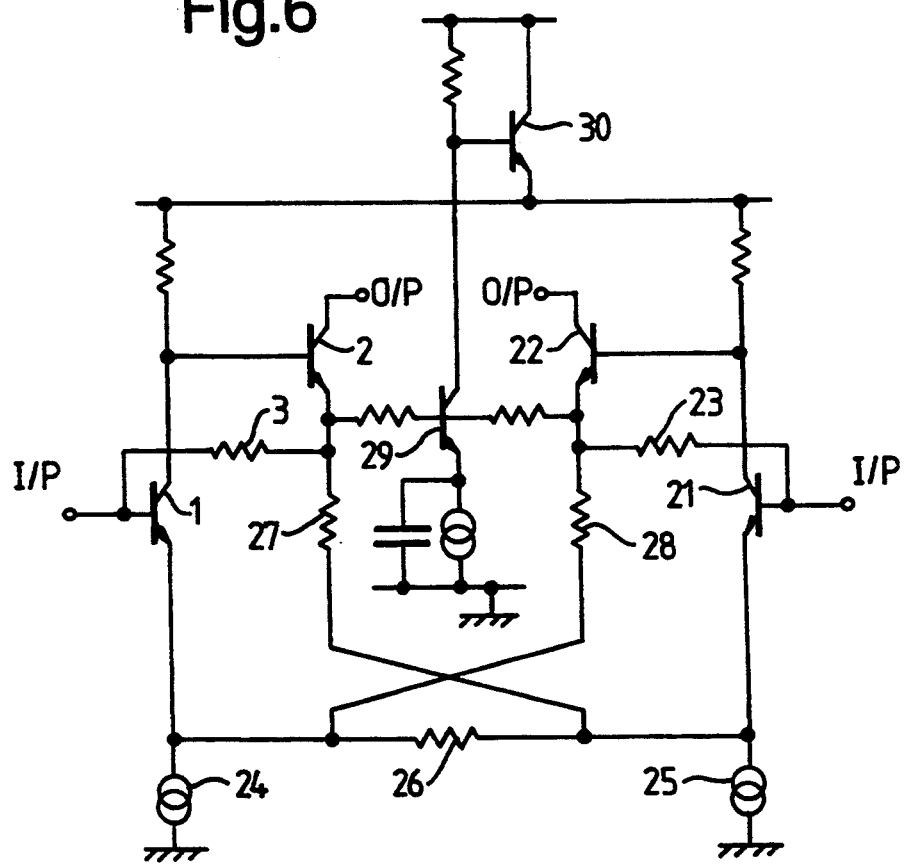

Referring now to FIGS. 5 and 6 a differential input/differential output embodiment comprises a symmetrical arrangement in which a pair of input transistors 1 and 21 have their respective collector electrodes directly connected to the base electrodes of output transistors 2 and 22, and their respective emitter electrodes connected to respective current sources 24 and 25, and interconnected by way of a resistor 26. The emitter electrodes of the transistors 2 and 22 are connected by way of resistors 3 and 23 respectively to the base electrodes of the transistors 1 and 21 respectively, and by way of resistors 27 and 28 respectively to the emitter electrodes of the transistors 21 and 1 respectively. The resistors 27 and 28 have values equal to half the required output resistance of the amplifier, while resistors 3 and 23 have values greater than those of the resistors 27 and 28 by the factor G and the resistor 26 has a value smaller than the required output resistance by the factor G.

As shown in FIG. 6 common mode feedback may be applied to the amplifier of FIG. 5 by means of a sensing transistor 29 and a further transistor 30, which are arranged to control the potential applied to the collector loads of the transistors 1 and 21 in dependence upon the mean value of the potentials at the emitter electrodes of the transistors 2 and 22.

Although the transistors are shown in the drawings as NPN junction transistors, it will be appreciated that they could equally well be PNP devices, darlington pairs or field effect transistors.

I claim:

1. A wideband constant impedance amplifier comprising first, second and third transistors each having a control electrode and an output current path between first and second output electrodes, the control electrode of the first transistor being connected to an input terminal of the amplifier, the first output electrode of the first transistor being connected by way of the output current path of the second transistor to a point of reference potential and by way of a first resistive element to the control electrode of the second transistor, the second output electrode of the first transistor being connected to load means and to the control electrode of the third transistor, and the first output electrode of the third transistor being connected to the control electrode of the first transistor by way of a second resistive element and to the control electrode of the second transistor by way of a third resistive element, the second output electrode of the third transistor being connected to an output terminal of the amplifier.

2. An amplifier in accordance with claim 1 wherein the third resistive element has a value of resistance equal to the required output resistance of the amplifier, and the first and second resistive elements have values of resistance respectively smaller and greater than said required output resistance by a factor equal to the open-loop voltage gain of said first transistor.

3. A wideband constant impedance amplifier comprising first, second, third and fourth transistors each having a control electrode and an output current path between first and second output electrodes, the control electrode of the first transistor being connected to an input terminal of the amplifier, the first output electrode of the first transistor being connected to a point of reference potential by way of a first resistive element, the second output electrode of the first transistor being connected to load means and to the control electrode of the second transistor, the second and third transistors having their first output electrodes connected to respective current sources and by way of second and third resistive means to the control electrode of the fourth transistor, the first output electrode of the second transistor also being connected to the control electrode of the first transistor by way of a fourth resistive element, the first output electrode of the fourth transistor being connected to a point of reference potential and the second output electrode of the fourth transistor being connected to load means and to the control electrode of the third transistor, the second output electrodes of the second and third transistors being connected to respective output terminals of the amplifier.

4. An amplifier in accordance with claim 3 wherein the second and third resistive elements each have a value of resistance equal to half the required output resistance of the amplifier, and the first and fourth resistive elements have values of resistance respectively smaller and greater than the values of the second and third resistive elements by a factor equal to the open-loop voltage gain of the first transistor.

5. A differential input differential output wideband constant impedance amplifier comprising first, second, third and fourth transistors each having a control electrode and an output current path between first and second output electrodes, the control electrodes of the first and fourth transistors being connected to respective input terminals of the amplifier, the second output electrodes of the first and fourth transistors being connected to respective load means and to the control electrodes of the second and third transistors respectively, the first output electrodes of the second and third transistors being connected by way of first and second resistive elements respectively to the control electrodes of the first and fourth transistors respectively, the first output electrodes of the first and third transistors being interconnected by way of a third resistive element, the first output electrodes of the second and fourth transistors being interconnected by way of a fourth resistive element, the first output electrodes of the first and fourth transistors being interconnected by way of a fifth resistive element, and the second output electrodes of the second and third transistors being connected to respective output terminals of the amplifier.

6. An amplifier in accordance with claim 5 wherein the third and fourth resistive elements have values of resistance equal to half the required output resistance of the amplifier, the first and second resistive elements have a value of resistance greater than the values of said third and fourth resistive elements by a factor equal to the open-loop voltage gain of said first transistor, and the fifth resistive element has a value of resistance smaller than said required output resistance by said factor.

7. An amplifier in accordance with claim 5 wherein there are provided means responsive to the potentials at the first output electrodes of said second and third transistors to vary the potential applied to said load means for the first and fourth transistors so as to provide common mode negative feedback.

8. A wideband constant impedance amplifier comprising first, second, third and fourth transistors each having a control electrode and an output current path between first and second output electrodes, the control electrode of the first transistor being connected to an input terminal of the amplifier, the first output electrodes of the first and third transistors being connected together and by way of a current source to a point of reference potential, the second output electrode of the first transistor being connected to load means and to the control electrode of the second transistor, the first output electrode of the second transistor being connected by way of a first resistive element to a point of reference potential and by way of a second resistive element to the control electrode of the first transistor, the second output electrode of the third transistor being connected to load means and to the control electrode of the fourth transistor, the control electrode of the third transistor being connected by way of a third resistive element to a point of reference potential and by way of a fourth resistive element to the first output electrode of the fourth transistor, the second output electrodes of the second and fourth transistors being connected to respective output terminals of the amplifier, the first and fourth resistive elements having values of resistance equal to half the required output resistance of the amplifier, and the second and third resistive elements having values of resistance respectively greater and smaller than the values of said first and fourth resistive elements by a factor equal to the open-loop voltage gain of the first transistor.

* * * * *